(12) United States Patent
Yato (10) Patent No.: US 7,067,860 B2
(45) Date of Patent: Jun. 27, 2006

(54) SOLID-STATE IMAGING DEVICE

(75) Inventor: Hidenori Yato, Oizumi-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/775,126

(22) Filed: Feb. 11, 2004

(65) Prior Publication Data

US 2004/0212031 A1 Oct. 28, 2004

(30) Foreign Application Priority Data

Feb. 21, 2003 (JP) .............................. 2003-043603

(51) Int. Cl.
*H01L 31/062* (2006.01)
(52) U.S. Cl. ..................................... 257/292; 257/291
(58) Field of Classification Search ................ 257/291, 257/292, 294, 431, 443, 461–463
See application file for complete search history.

(56) References Cited

U.S. PATENT DOCUMENTS

| 6,051,857 | A | 4/2000 | Miida .......................... 257/292 |
| 6,504,194 | B1 * | 1/2003 | Miida .......................... 257/292 |

FOREIGN PATENT DOCUMENTS

JP A 11-195778 7/1999

\* cited by examiner

*Primary Examiner*—Hung Vu
(74) *Attorney, Agent, or Firm*—Oliff & Berridge, PLC (57) ABSTRACT

The invention can provide a solid-state imaging device that can include a pixel array where a plurality of unit pixels including a photo diode and an insulated gate field effect transistor for detecting photocharges are arranged, and a control circuit that controls the operation of the pixel array. The control circuit can cause a junction region between a semiconductor substrate of a first conductivity type and a semiconductor layer of a second conductivity type to be in a forward bias state so as to accumulate a predetermined amount of the charge of a predetermined conductivity type in an accumulation region, and control discharging the charges of a predetermined conductivity type accumulated in the accumulation region thereafter. Accordingly, the invention provides a solid-state imaging element that avoids deterioration of image quality caused by photocharges accumulated during previous imaging.

5 Claims, 11 Drawing Sheets

SOLID-STATE IMAGING DEVICE

Japanese Patent Application No. 2003-043603, filed on Feb. 21, 2003, is hereby incorporated by reference in its entirety.

BACKGROUND OF THE INVENTION

1. Field of Invention

The present invention relates to a MOS solid-state imaging element of a threshold voltage modulation system.

2. Description of Related Art

A variety of electronic equipment, such as cellular phones and digital cameras provided with a miniaturized camera have become increasingly popular. As an example of an imaging element for such a camera, a MOS solid-state imaging element that is referred to as an imaging element of a threshold voltage modulation system has been developed. See, for example, Japanese Patent Publication Laid-Open No. 11-195778.

When an imaging element of a threshold voltage modulation system is compared to a CCD (Charge Coupled Device) solid-state imaging element that has the same pixel size and pixel number as it, the power consumption thereof is lower than that of a CCD solid-state imaging element although it is inferior to a CCD solid-state imaging element in optical sensitivity. In addition, compared to a CMOS (Complementary Metal Oxide Semiconductor) solid-state imaging element that has the same pixel size and pixel number, an imaging element of a threshold voltage modulation system has higher optical sensitivity although the power consumption is the same.

An imaging element of a threshold voltage modulation system has a special pixel structure in order to enhance the optical sensitivity thereof more than that of a CMOS solid-state imaging element and improve the image quality. Specifically, in one pixel (it is also referred to as "unit pixel" hereinafter) of a CMOS solid-state imaging element, three (3) or four (4) transistors are used in order to convert charges that were photoelectrically converted in response to the amount of received light by a photo diode (they are also referred to as "photocharges" hereinafter) into voltage (it is referred to as "charge-voltage conversion" hereinafter) and amplify it. Meanwhile, in one unit pixel of an imaging element of a threshold voltage modulation system, only one transistor is used. Furthermore, a structure that is special and is different from that of a general MOS transistor is used for this one transistor. Specifically, a hollow of energy that is referred to as a carrier pocket (it is also referred to as "well") is formed in the transistor. This carrier pocket has a structure where potential against, for example, a hole is lowered. Therefore, holes (they are also referred to as "photoholes") of photocharges generated in a photo diode is accumulated. The threshold of a transistor changes depending on the number of photoholes accumulated in a carrier pocket such that the source potential of a source follower formed of this transistor changes. Therefore, pixel data depending on the amount of received light can be detected by reading out source potential that changes depending on the number of photoholes accumulated in a carrier pocket.

SUMMARY OF THE INVENTION

When one image is picked up by an imaging element of a threshold voltage modulation system, photocharges accumulated in a carrier pocket of each pixel are discharged (reset) before imaging. This is because, if photocharges accumulated in previous imaging remain, the residual photocharges are added to photocharges based on which image data is read out such that there is the case where the residual photocharges cause negative effect on each detected pixel data as a residual image. However, in general, it is difficult to discharge photocharges accumulated in previous imaging from a carrier pocket completely within a certain limited time. Therefore, in an imaging element of a threshold voltage modulation system, there is a need for avoiding the deterioration of image quality caused by a residual image due to photocharges accumulated in previous imaging.

In view of the above-described problem, the present invention is intended to provide an art by which the deterioration of image quality caused by a residual image due to photocharges accumulated in previous imaging can be avoided in an imaging element of a threshold voltage modulation system.

In order to solve at least a part of the above-described problem, a solid-state imaging device of the present invention can include a pixel array having a plurality of unit pixels. Each of the unit pixels can include a photo diode and an insulated gate field effect transistor for detecting photocharges. The solid-state imaging device also includes a control circuit controlling the operation of the pixel array. The photo diode and the insulated gate field effect transistor share a well region of a first conductivity type that is formed in a semiconductor layer of a second conductivity type. The semiconductor layer of the second conductivity type is formed on a semiconductor substrate of the first conductivity type. An accumulation region for accumulating charges of a given conductivity type generated in response to light incident on the photo diode is formed in the well region of the insulated gate field effect transistor. The control circuit forward biases a junction region between the semiconductor substrate and the semiconductor layer so as to accumulate a predetermined amount of the charges of a given conductivity type in the accumulation region, and discharges the charges of a given conductivity type accumulated in the accumulation region thereafter.

In the solid-state imaging device of the invention, the junction region between the semiconductor substrate and the semiconductor layer is forward biased so as to accumulate a predetermined amount of the charges of a given conductivity type in the accumulation region previously, before the photocharges of a given conductivity type accumulated in the accumulation region by imaging are discharged. Thus, since the charges of a given conductivity type accumulated in the accumulation region can be discharged after a predetermined amount of the charges are accumulated, the amount of the charges of a given conductivity type that remain in the accumulation region after a certain discharging period can be made be almost constant. If the amount of residual charges of a given conductivity type is almost constant, using the state where the constant amount of the charges of a given conductivity type remain, as a reference, the amount of the charges of a given conductivity type accumulated in response to incident light can be detected. Therefore, in a solid-state imaging element of a threshold voltage modulation system, the deterioration of image quality caused by a residual image due to charges accumulated in previous imaging can be avoided.

In addition, the insulated gate field effect transistor includes a source diffused region of the second conductivity type formed on a surface of the well region, and a drain diffused region of the second conductivity type formed on a surface of the semiconductor layer other than the surface of the well region. The transistor also can include a gate electrode formed over the well region between the drain diffused region and the source diffused region with a gate insulating film therebetween, and a channel region formed in the surface of the well region under the gate electrode and having an impurity layer of the second conductivity type. The transistor also includes a heavily doped buried layer of the first conductivity type formed under the channel region in the well region and near the source diffused region, having an impurity concentration higher than that of the well region, and being the accumulation region. The control circuit applies predetermined voltage to at least the drain diffused region to forward bias the junction region so as to accumulate a predetermined amount of the charges of a given conductivity type in the accumulation region, and discharges the charges of a given conductivity type accumulated in the accumulation region thereafter.

The junction region between the semiconductor substrate and the substrate layer is easily forward biased by applying predetermined voltage to at least the drain diffused region as described above.

In addition, a state where a predetermined amount of the charges of a given conductivity type are accumulated is preferably the saturated state where the maximum amount of the available charges of a given conductivity type are accumulated in the accumulation region.

Since the saturated state where the maximum amount of the available charges of a given conductivity type are accumulated in the accumulation region is almost constant, if the junction region between the semiconductor substrate and the semiconductor layer is forward biased, the accumulation state of the accumulation region can be easily made be in a saturated state regardless of the amount of the charges accumulated in the accumulation region.

Furthermore, if the first conductivity type is a P type and the second conductivity type is an N type, the charges of a given conductivity type are holes. Furthermore, if the first conductivity type is an N type and the second conductivity type is a P type, the charges of a given conductivity type are electrons.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments of the present invention will be described below.

Figure 1:
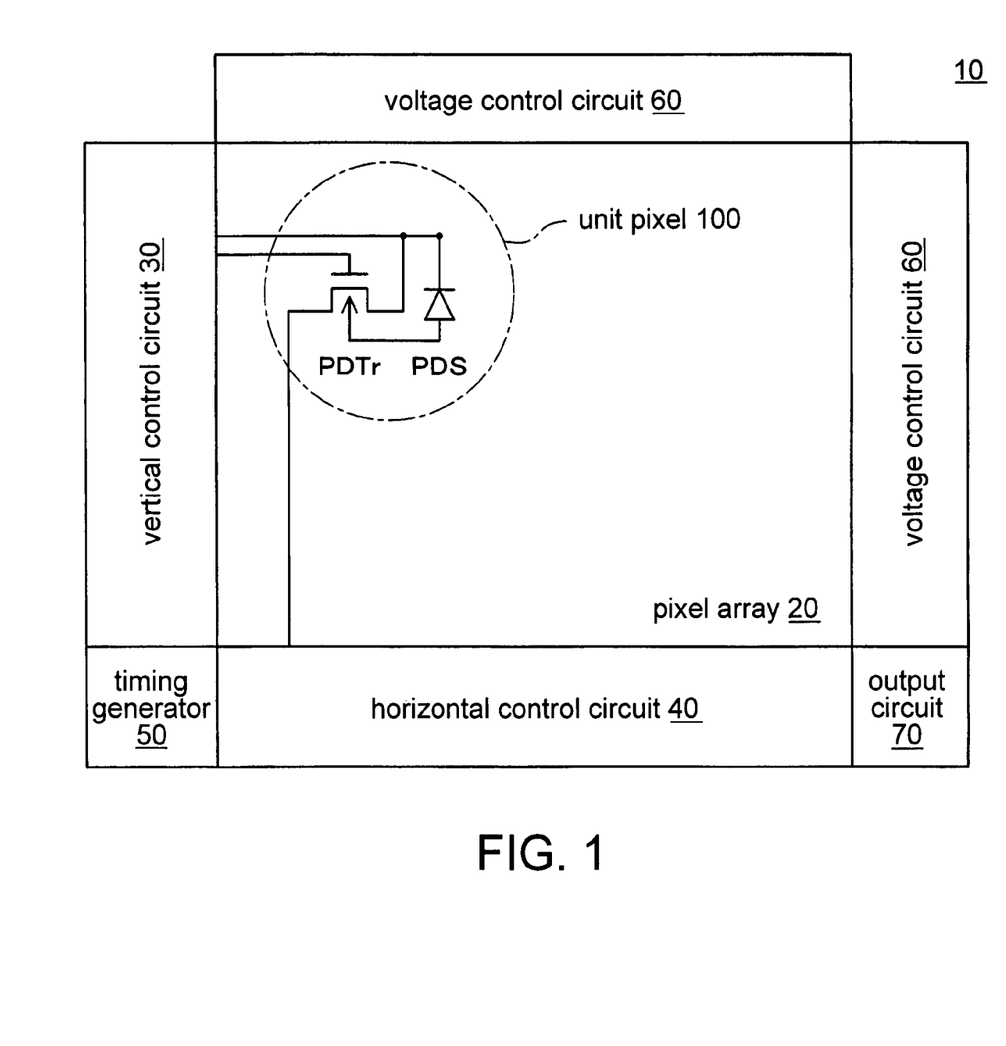
FIG. 1 is an explanatory diagram showing the whole structure of an image sensor according to an embodiment of the present invention.

A. Structure of a Solid-State Imaging Device:

FIG. 1 is an explanatory diagram showing the whole structure of an image sensor (a solid-state imaging device) according to an embodiment of the present invention. An image sensor 10 includes a pixel array 20 where a unit pixel 100 corresponds to one pixel of an image and a plurality of them are arranged in a matrix. The unit pixel 100 is formed of a single of photo diode (PDS) and a single of NMOS transistor (PDTr) for detecting photocharges.

In addition, a vertical control circuit 30 and a horizontal control circuit 40 that drive the unit pixel 100 arranged in a matrix in the pixel array 20 are disposed on the left side and the lower side of the pixel array 20, respectively. Furthermore, between the vertical control circuit 30 and the horizontal control circuit 40, a timing generator 50 that generates a timing signal becoming the standard of the operation of the vertical and horizontal control circuits 30 and 40 is disposed. In addition, a voltage control circuit 60 that generates a variety of voltage needed for the operation of each unit pixel 100 is disposed on the right and upper sides of the pixel array 20. Furthermore, an output circuit 70 that outputs picked up image data is disposed on the right side of the horizontal control circuit 40.

Figure 2:
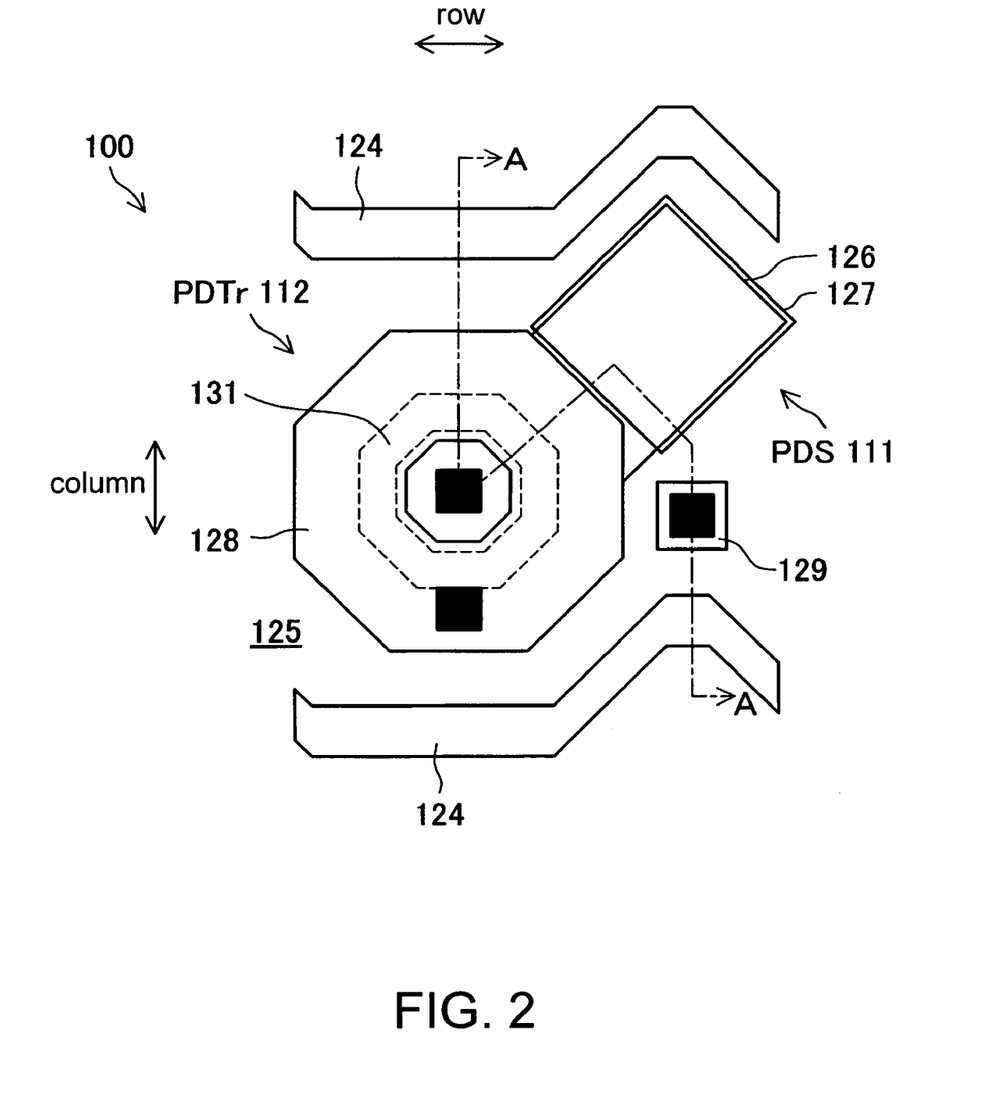
FIG. 2 is a schematic plan view showing an example of the layout of elements in a unit pixel.
Figure 3:
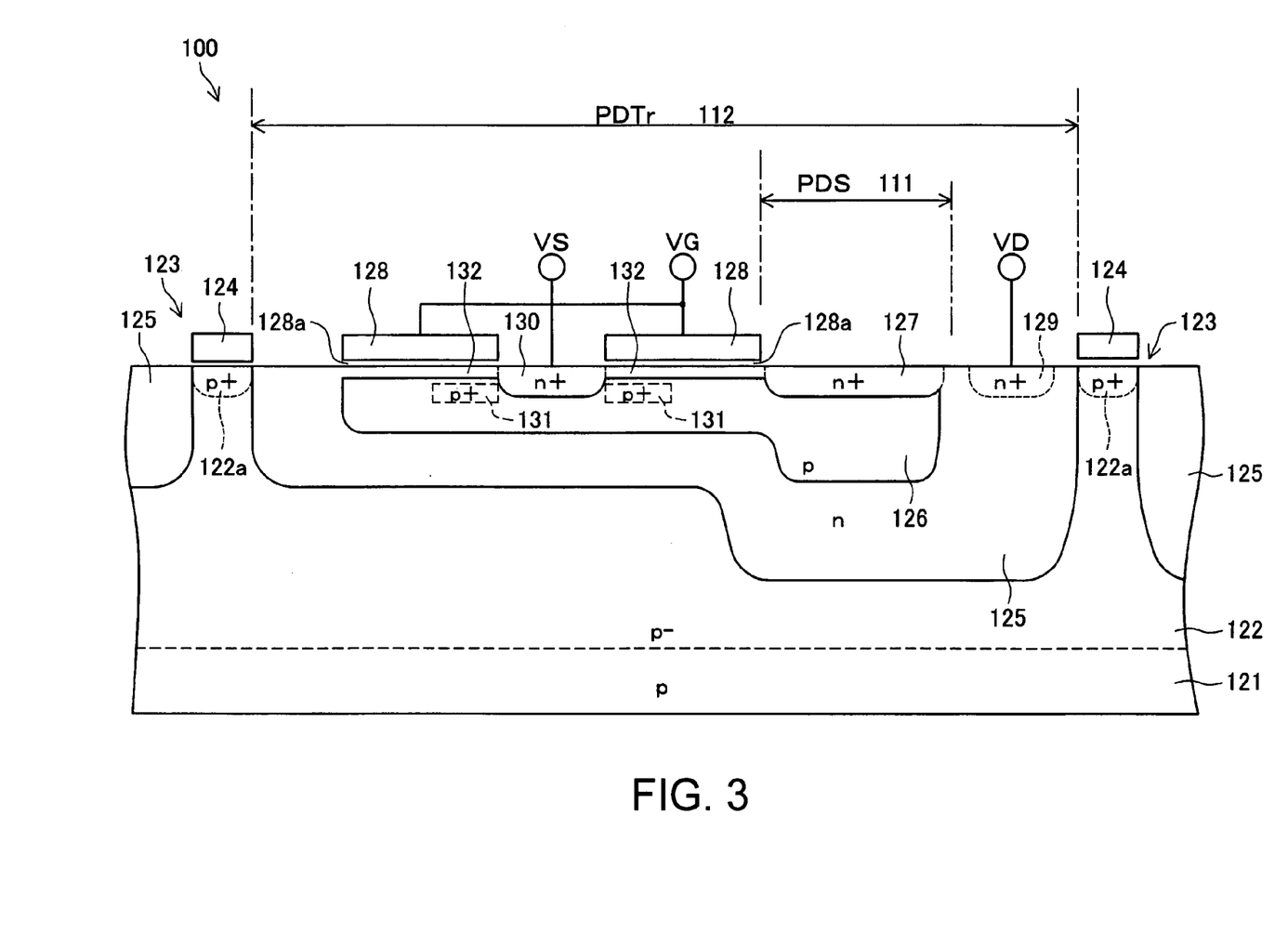
FIG. 3 is a schematic sectional view along A—A line of FIG. 2.

FIG. 2 is a schematic plan view showing an example of the layout of elements in a unit pixel. FIG. 3 is a schematic sectional view along A—A line of FIG. 2. In the unit pixel 100, a photo diode (PDS) 111 and an NMOS transistor (PDTr) 112 for detecting photocharges are formed adjacent to each other.

As shown in FIG. 3, on a substrate 121 that is made of P type silicon (it is also referred to as "P type substrate" hereinafter), P type silicon whose impurity concentration is lower than that of the substrate 121 (it is referred to as "P– type" hereinafter) is epitaxially grown, and thereby a P– type substrate layer 122 is formed on the substrate 121. The P type substrate 121 and the P– type substrate layer 122 substantially form a P type semiconductor substrate. In addition, on a boundary of unit pixels adjacent to each other in a column direction, a pixel isolation region 123 defined by an element isolation gate 124 formed on the P– type substrate layer 122 and a surface of the substrate through an oxide film not shown in the drawing is formed. Each unit pixel 100 is electrically isolated from other pixels in the column direction by the pixel isolation region 123. The pixel isolation region 123 is not formed on a boundary of unit pixels adjacent to each other in a row direction. Unit pixels in the row direction share a single of well region 125 with an N type (it is referred to as "N well region" hereinafter). Here, the pixel isolation region 123 may be formed on a boundary of unit pixels adjacent to each other in the row direction. An impurity diffused region 122a with a P type and whose impurity concentration is higher than that of the P type substrate 121 (it is referred to as "P+ type" hereinafter) is formed on a surface of the P− type substrate layer 122 in the pixel isolation region 123 in order to enhance the degree in isolation between the N well region 125 and the N well region 125 adjacent thereto. Specifically, punch-through that is caused on a surface part between the N well region 125 and the N well region 125 adjacent thereto is avoided.

In addition, in a region of the N well region 125 corresponding to a single of the unit pixel 100, a single of P well region 126 that is shared by the photo diode 111 and the NMOS transistor 112 is buried. The P well region 126 of the photo diode 111 forms a region where charges are generated by light irradiation. The P well region 126 of the NMOS transistor 112 forms a region where charges are transferred and a region where charges are accumulated.

The photo diode 111 is formed of the P well region 126, the N well region 125, and an impurity diffused region 127 that is formed on the surface of the N well region 125 to sandwich the P well region 126. The impurity diffused region 127 is an N type region whose impurity concentration is higher than that of the N well region 125 (it is referred to as "N+ type" hereinafter).

The NMOS transistor 112 includes a ring-shaped gate electrode 128. The ring-shaped gate electrode 128 is surrounded by the N well region 125. A drain diffused region 129 with an N+ type is formed on any part of a surface of the N well region 125 surrounding the gate electrode 128 and the P well region 126. Furthermore, a source diffused region 130 with an N+ type is formed on the center part of the gate electrode 128. In addition, a gate insulating film 128a is formed between the gate electrode 128 and an N well region 132, which is under the gate electrode 128. The N well region 132, which is in a surface of the P well region 126 under the gate electrode 128, becomes a channel region.

Furthermore, a carrier pocket 131 with a P+ type is formed in the P well region 126 under the channel region to surround the source diffused region 130. Details about the carrier pocket 131 will be described later.

Here, three black squares shown in the plan view of FIG. 2 indicate contact areas of a gate electrode, a drain electrode, and a source electrode. However, in the sectional view of FIG. 3, these contact areas are omitted and voltage of each electrode is indicated as gate voltage VG, drain voltage VD, and source voltage VS.

Figure 4:
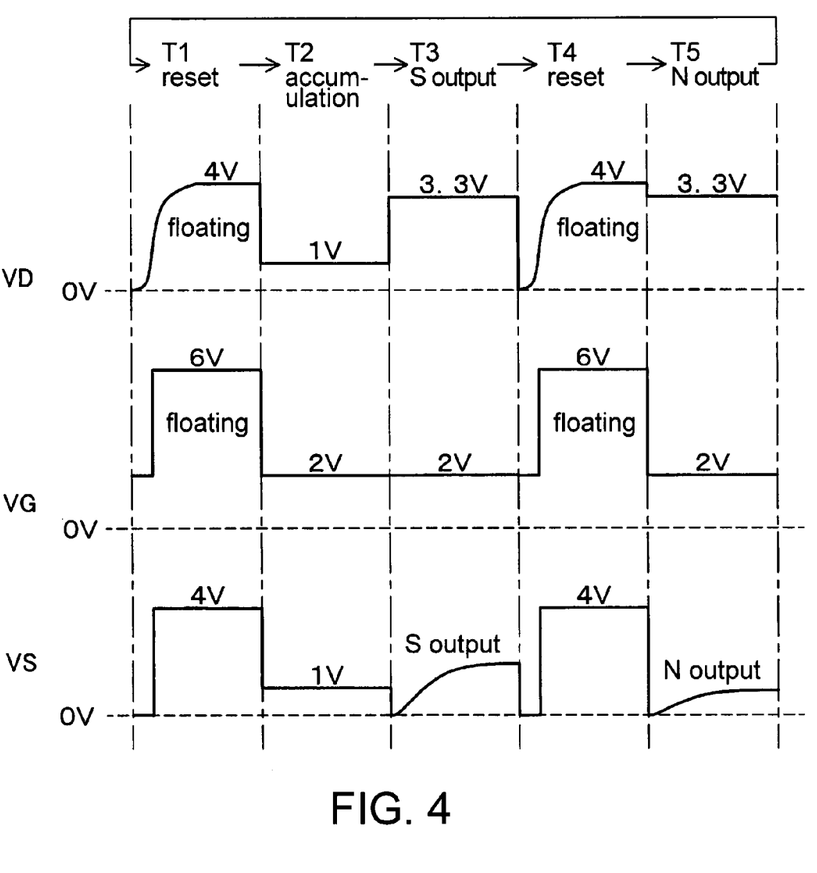
FIG. 4 is an explanatory diagram showing the sequence of imaging in one unit pixel as a comparative example.

B. Imaging Operation of a Comparative Example:

First, the basic imaging operation is explained as a comparative example previous to the explanation of the imaging operation of the present embodiment. FIG. 4 is an explanatory diagram showing the sequence of imaging in one unit pixel as a comparative example. As shown in FIG. 4, one time of imaging operation is executed through five periods of a reset period (T1), an accumulation period (T2), a signal output period (T3), a reset period (T4), and a noise output period (T5). The imaging operation is repeatedly executed by repeating this sequence. Here, each of another unit pixels is the same as this.

Figure 5:
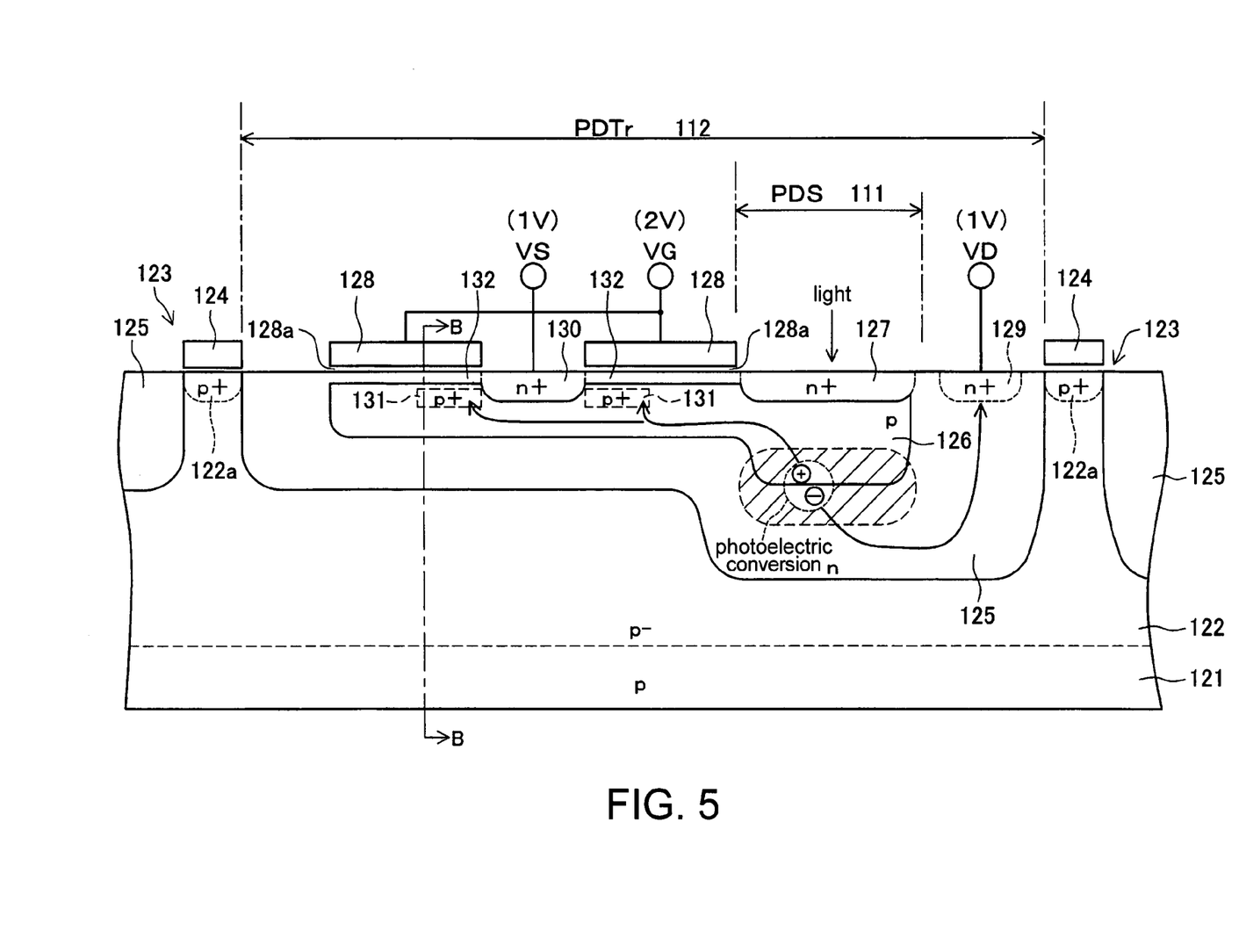
FIG. 5 is an explanatory diagram showing the operation during an accumulation period.

B1. Accumulation Period:

FIG. 5 is an explanatory diagram showing the operation during an accumulation period. FIG. 5 shows a schematic sectional view of the unit pixel 100 as with FIG. 3. In an accumulation period (the period T2 of FIG. 4), light from an image that is picked up is received and photoelectrically converted by the photo diode 111 of the unit pixel 100 that corresponds to each pixel. Then, photoholes that are generated by the photoelectric conversion are accumulated in the carrier pocket 131 of the P well region 126.

In an accumulation period, voltage 2V as the gate voltage VCG and voltage 1V as the drain voltage VD and the source voltage VS are applied to each electrode so as to turn the NMOS transistor 112 "on". Here, each voltage that is applied as the gate voltage VCG, the drain voltage VD, and the source voltage VS is generated by a general constant voltage generating circuit included in the voltage control circuit 60 of FIG. 1. These voltages are provided through the vertical control circuit 30 and the horizontal control circuit 40. The PN junction formed of the N well region 125 and the P well region 126 of the photo diode 111 is in a reverse bias state and a depletion region (a hatching area of FIG. 5 for example) is formed in the vicinity of the junction interface of the PN junction.

In the depletion region, light entering the photo diode 111 is photoelectricaly converted into a charge (a photocharge) as a pair of an electron (a photoelectron) and a hole (a photohole). Here, photoelectrons of photocharges are spread in the N well region 125 and are discharged through the drain diffused region 129. Meanwhile, photoholes are spread in the P well region 126.

Figure 6:
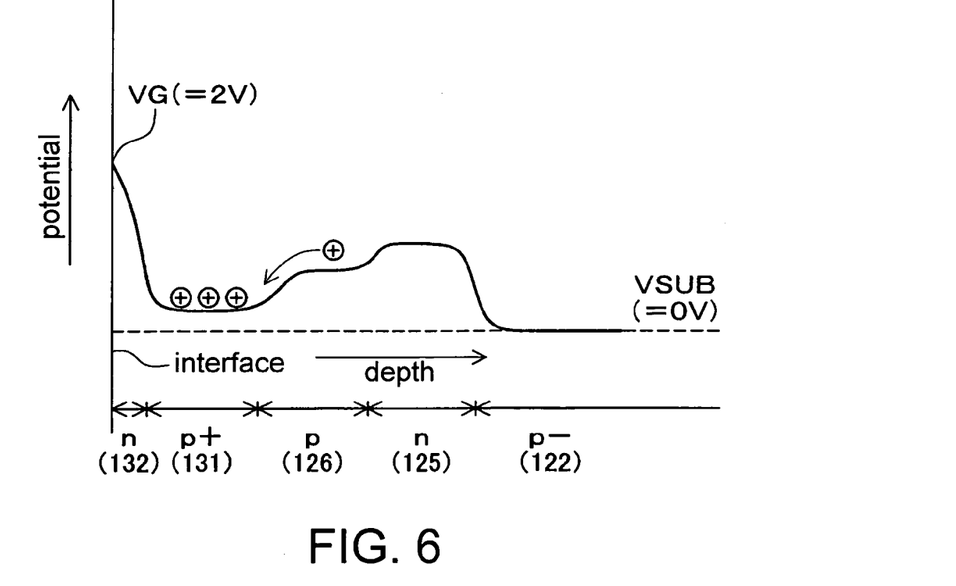
FIG. 6 is an explanatory diagram showing the potential distribution of a section along B—B line of FIG. 5.

FIG. 6 is an explanatory diagram showing the potential distribution of a section along B—B line of FIG. 5. The vertical axis represents potential and the horizontal axis represents the depth from a surface of the substrate (interface). Since the potential of the carrier pocket 131 is lower than that of the P well region 126 as shown in FIG. 6, generated photoholes are collected and accumulated in the carrier pocket 131.

B2. Reading Out Period:

A reading out period, namely a signal output period (S output period) shown as the period T3 of FIG. 4 is a period when imaging data based on photoholes accumulated in an accumulation period is read out. In addition, a noise output period (N output period) shown as the period T5 of FIG. 4 is a period when noise data at the state where photoholes are not accumulated is read out.

Figure 7:
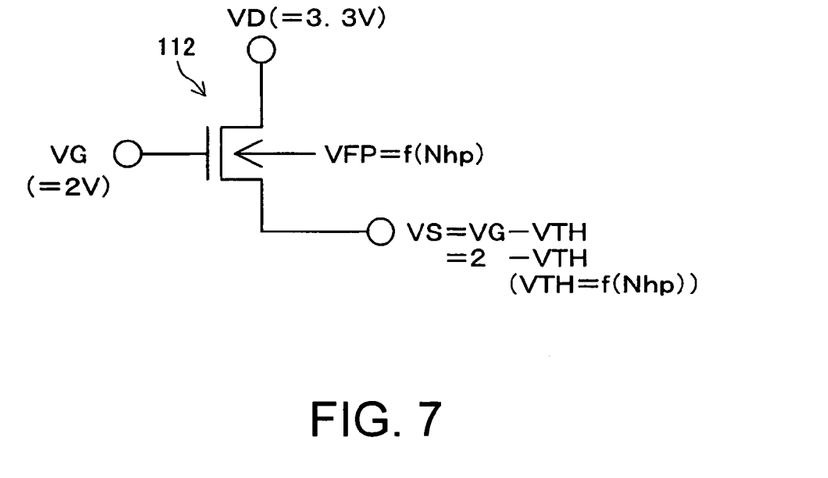
FIG. 7 is an explanatory diagram showing the NMOS transistor during a reading out period.

FIG. 7 is an explanatory diagram showing the NMOS transistor during a reading out period. In a reading out period, the NMOS transistor 112 is operated as a source follower circuit so as to output a signal that is read out as shown in FIG. 7.

In a reading out period, bias voltage is applied to the NMOS transistor 112. For example, voltage 2V as the gate voltage VG is applied to the gate electrode 128 and voltage 3.3V as the drain voltage VD is applied to the drain diffused region (drain electrode) 129 as shown in FIG. 7. A load circuit not shown in the drawing is coupled to the source diffused region (source electrode) 130. At this time, the source voltage VS is represented by the following formula when VTH is threshold voltage of the NMOS transistor 112.

$$VS = VG - VTH \tag{1}$$

Here, the threshold voltage VTH changes depending on the number of photoholes accumulated in the carrier pocket 131. Namely, the threshold voltage VTH is represented by a function f (Nfp) including the number of holes Nhp as a parameter.

Therefore, the source voltage VS represented by formula (1) changes depending on the number of accumulated holes Nhp. Namely, the source voltage VS becomes voltage that depends on the amount of light received by the photo diode 111 such that imaging data is output during an S output period shown as the period T3 of FIG. 4. Furthermore, noise data is output during an N output period shown as the period T5 of FIG. 4.

In addition, imaging data from which a noise component is removed can be obtained by subtracting noise data that is read out during an N output period (the period T5) from imaging data that is read out during an S output period (the period T3).

Figure 8:
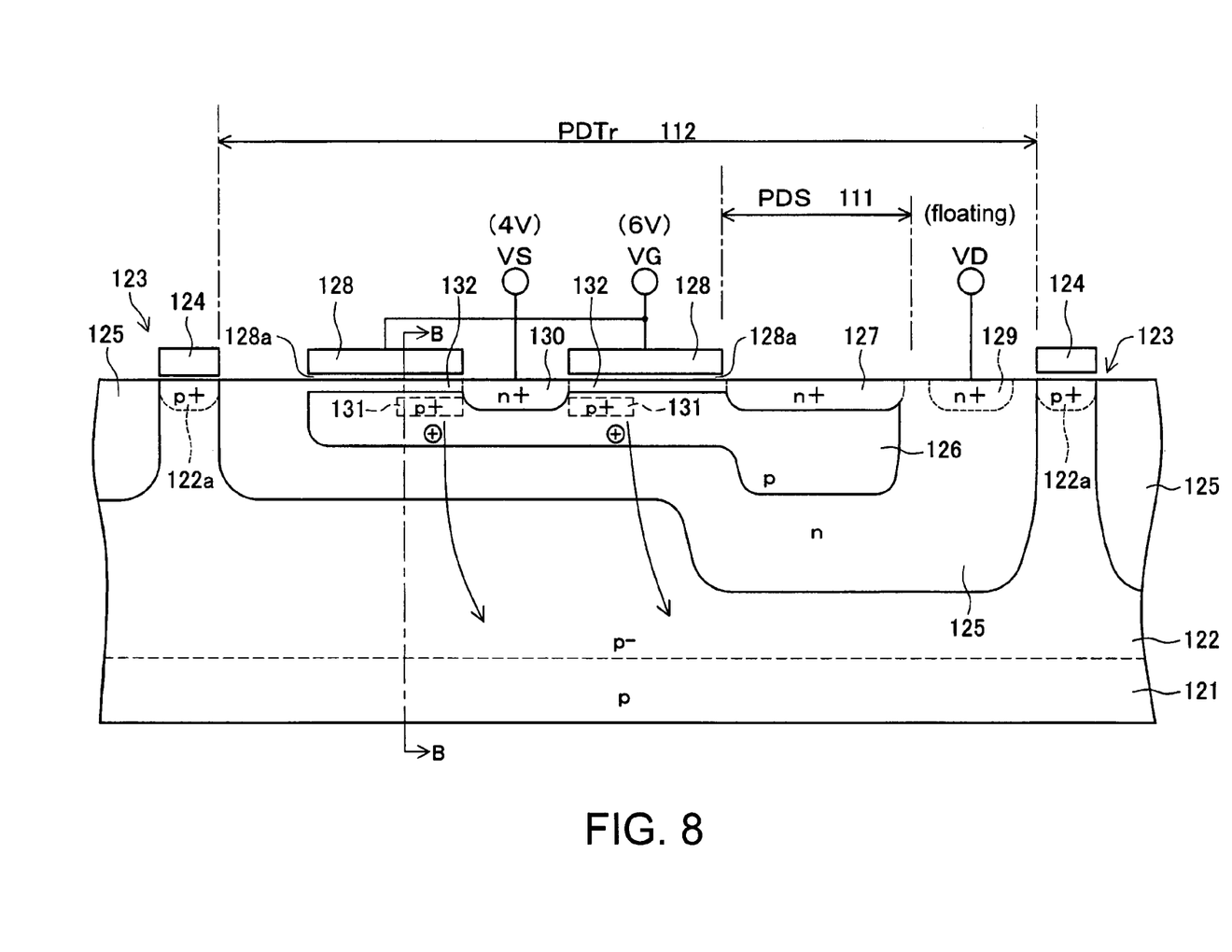
FIG. 8 is an explanatory diagram showing the operation during a reset period.

B3. Reset Period:

FIG. 8 is an explanatory diagram showing the operation during a reset period. FIG. 8 shows a schematic sectional view of the unit pixel 100 as with FIG. 5. In a reset period shown as the period T1 of FIG. 4, residual holes in the carrier pocket 131 are previously discharged toward a side of the P type substrate 121 in order to accumulate photoholes generated in the photo diode 111 during an accumulation period, the period T2. Furthermore, in a reset period shown as the period T4 of FIG. 4, holes that are previously accumulated in the carrier pocket 131 during an accumulation period, the period T2, are discharged toward a side of the P type substrate 121.

Figure 9:
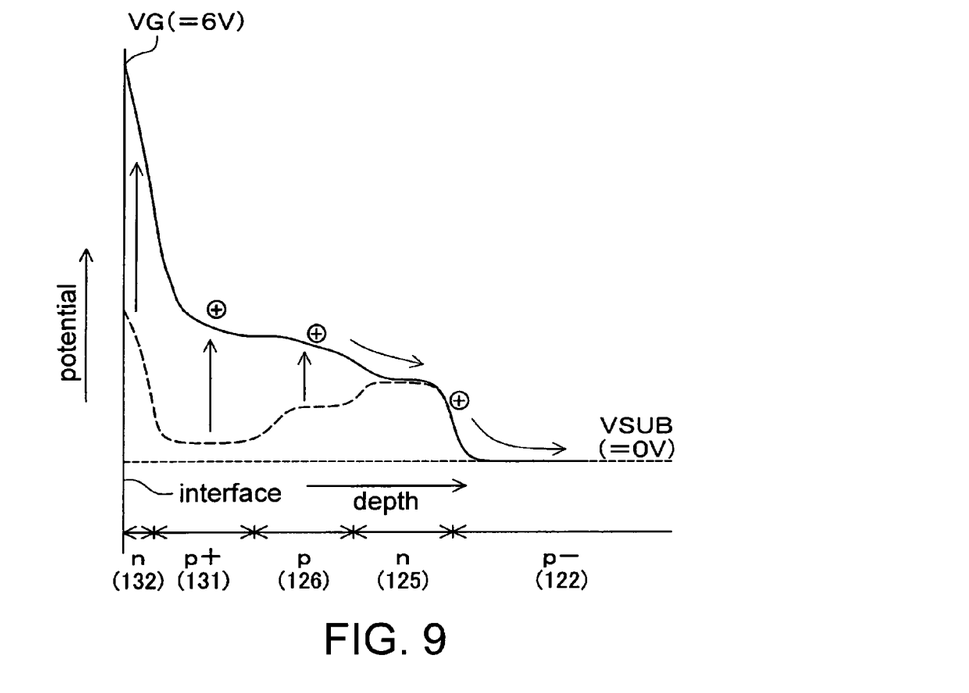
FIG. 9 is an explanatory diagram showing the potential distribution of a section along B—B line of FIG. 8.

FIG. 9 is an explanatory diagram showing the potential distribution of a section along B—B line of FIG. 8. The vertical axis represents potential and the horizontal axis represents the depth from a surface of the substrate (interface).

Here, in a reset period, voltage higher than usual operation voltage is applied to the gate electrode 128, the drain diffused region 129, and the source diffused region 130. For example, as the source voltage VS, voltage 4V against initial voltage value 0V is applied to the source diffused region (source electrode) 130. However, substrate voltage VSUB of the P type substrate 121 is GND (an earth: 0V) through a substrate electrode not shown in the drawing and the potential of the P- type substrate layer 122 is almost 0V similarly.

At this time, even if the gate electrode 128 is in a floating state, voltage 6V as the gate voltage VG can be applied thereto by capacitance coupling between the source and the gate. At the same time, since the channel region under the gate electrode 128 becomes conductive, even if the drain voltage VD is in a floating state, voltage 4V that is applied to the source diffused region 130 as the source voltage VS is almost directly applied to the drain diffused region 129 and the N well region 125 including the drain diffused region 129.

At this time, the potential of a surface of the substrate (interface) is highest and potential becomes smaller when distance from the surface of the substrate along a depth direction is larger as shown by a full line of FIG. 9. Therefore, residual holes in the carrier pocket 131 can be discharged toward a side of the P- type substrate layer 122 and the P type substrate 121, whose potentials are lower than that of the carrier pocket 131. Here, a dashed line of FIG. 9 represents potential distribution during an accumulation period, which was shown in FIG. 6.

Figure 10:
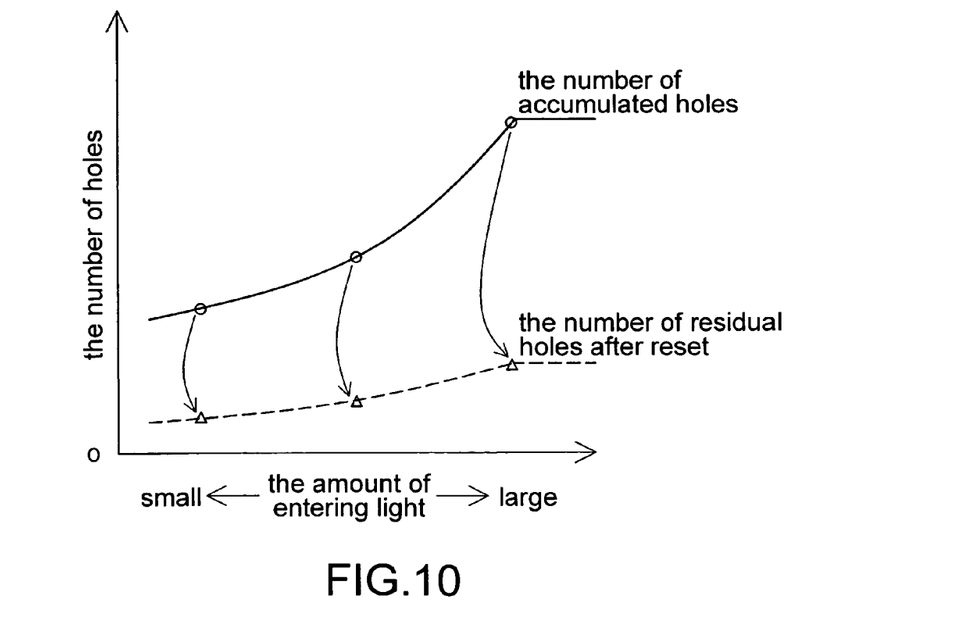
FIG. 10 is an explanatory diagram explaining about the number of residual holes after reset operation is completed in a reset period.

B4. Operation:

There can be the situation that will be shown below in the sequence of imaging of the above-described comparative example. FIG. 10 is an explanatory diagram explaining about the number of residual holes after reset operation is completed in a reset period. In the case where photoholes accumulated in the carrier pocket 131 are reset by discharging photoholes from the carrier pocket 131 as described above, the number of residual holes in the carrier pocket 131 is represented by an exponential function including time as a parameter generally. Therefore, regardless of the number of accumulated holes, it can be difficult to make the number of residual holes be 0.

Furthermore, the number of accumulated holes in the carrier pocket 131 changes depending on the amount of light entering the photo diode 111. The number of accumulated holes is large when the amount of entering light is large, and is small when it is small. At this time, although the number of holes that are discharged in the same reset period is large when the number of accumulated holes at the start of reset is large, and is small when it is small, the number of residual holes is also large when the number of accumulated holes is large, and is small when it is small. Therefore, depending on the number of accumulated holes, namely the amount of entering light, the number of residual holes that are not discharged from the carrier pocket 131 during a reset period also changes. If the number of residual holes is constant, an effect due to the number of residual holes can be canceled as noise data. However, if the number of residual holes changes depending on the number of accumulated holes as described above, an effect due to the number of residual holes depending on the change of the amount of entering light cannot be canceled such that there is the case where an image that was picked up in the previous cycle remains in an image that is picked up in the next cycle, as a residual image.

C. Imaging Operation of an Embodiment:

In order to solve the problem of the comparative example, an imaging element is operated as explained below in the present embodiment.

Figure 11:
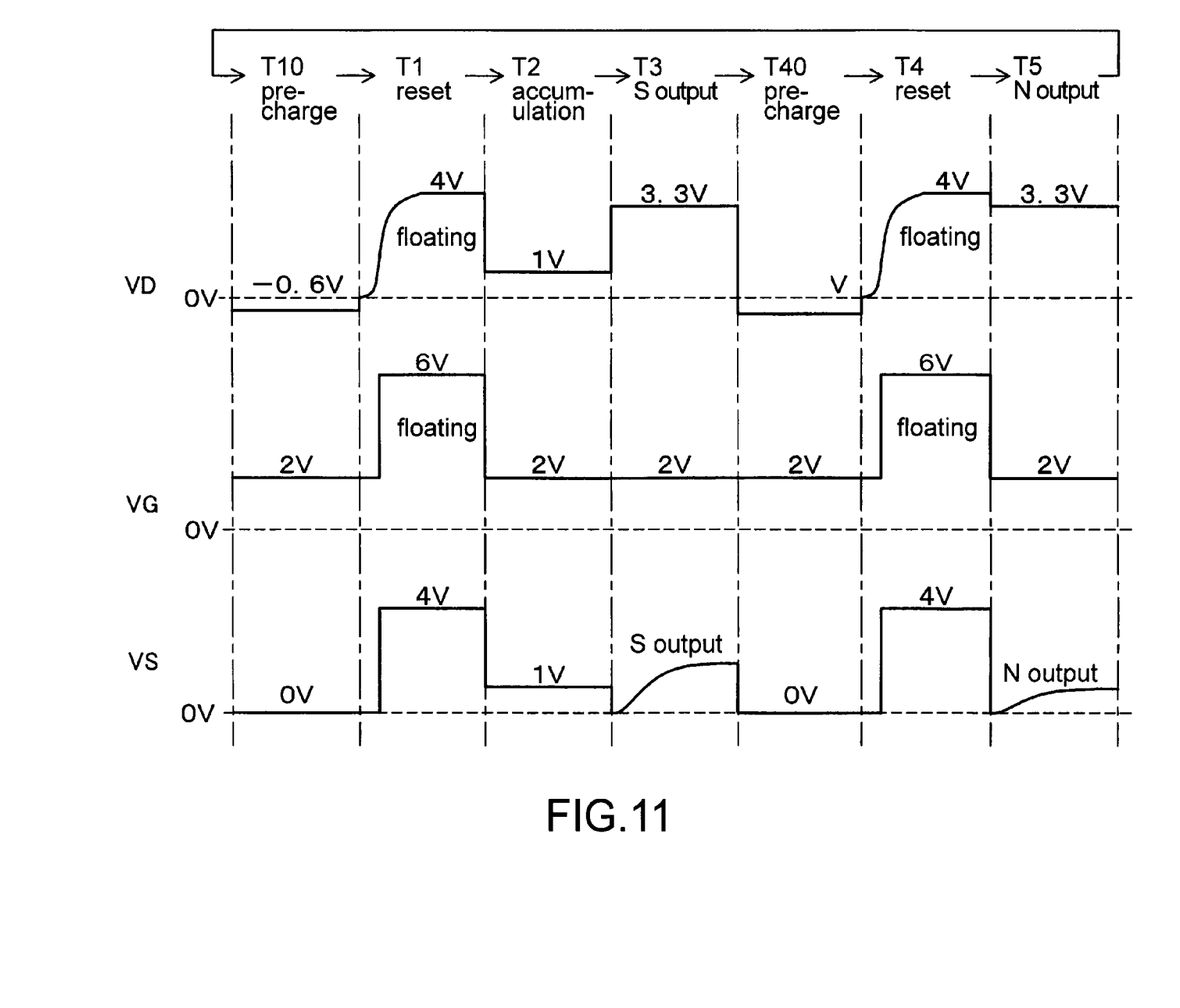
FIG. 11 is an explanatory diagram showing the sequence of imaging in one unit pixel as an embodiment.

FIG. 11 is an explanatory diagram showing the sequence of imaging in one unit pixel as an embodiment. The sequence of the imaging operation of the embodiment is the same as that of the comparative example except that a pre-charge period (a period T10 and a period T40) is set before a reset period (the period T1 and the period T4) in the sequence of imaging as the comparative example of FIG. 4. Therefore, only the operation of the unit pixel 100 during a pre-charge period will be described below.

Figure 12:
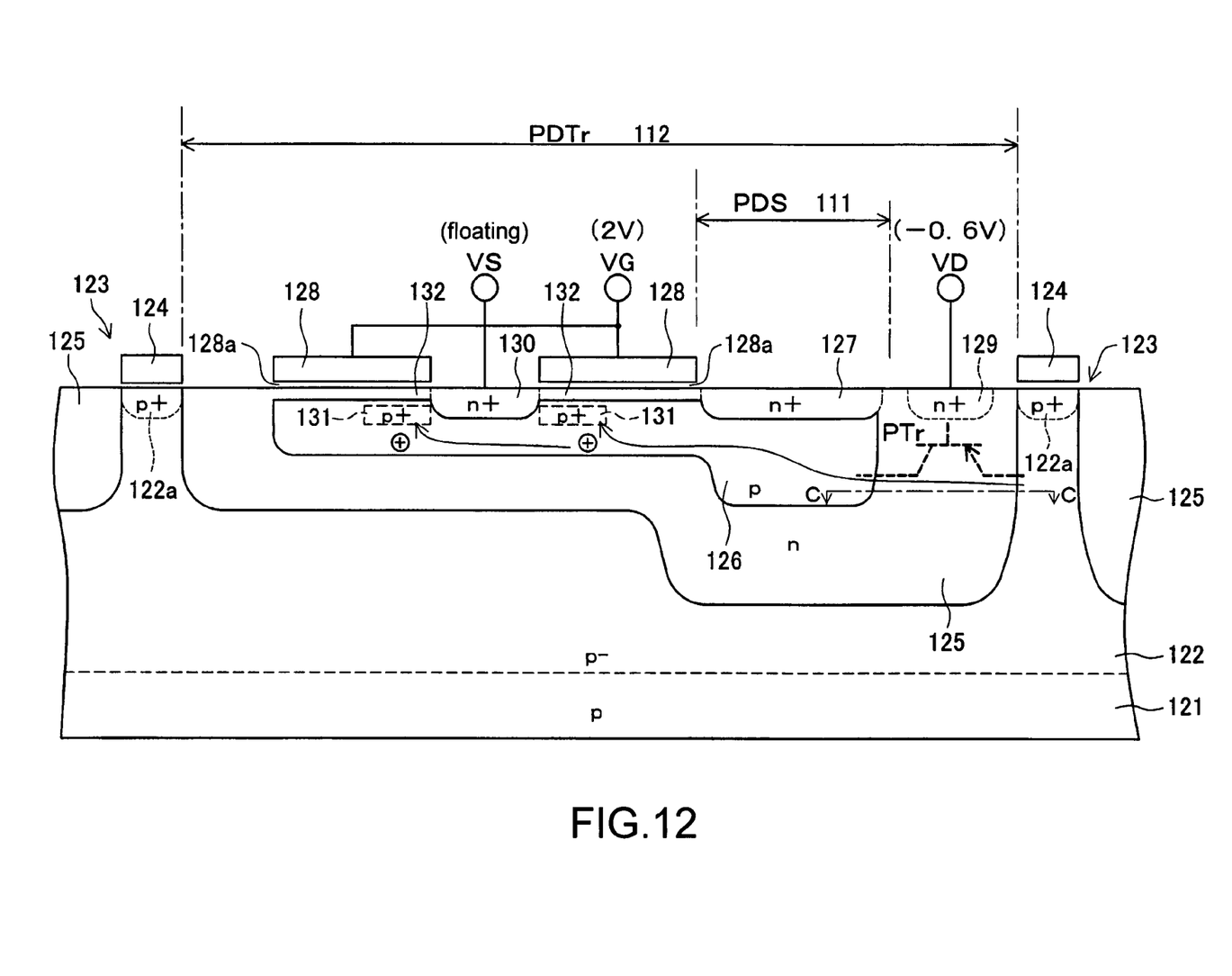
FIG. 12 is an explanatory diagram showing the operation during a pre-charge period.

FIG. 12 is an explanatory diagram showing the operation during a pre-charge period. FIG. 12 shows a schematic sectional view of the unit pixel 100 as with FIG. 3. In a pre-charge period (the period T10 and the period T40 of FIG. 11), holes are accumulated in the carrier pocket 131 before a reset operation during a reset period (the period T1 and the period T4).

Figure 13:
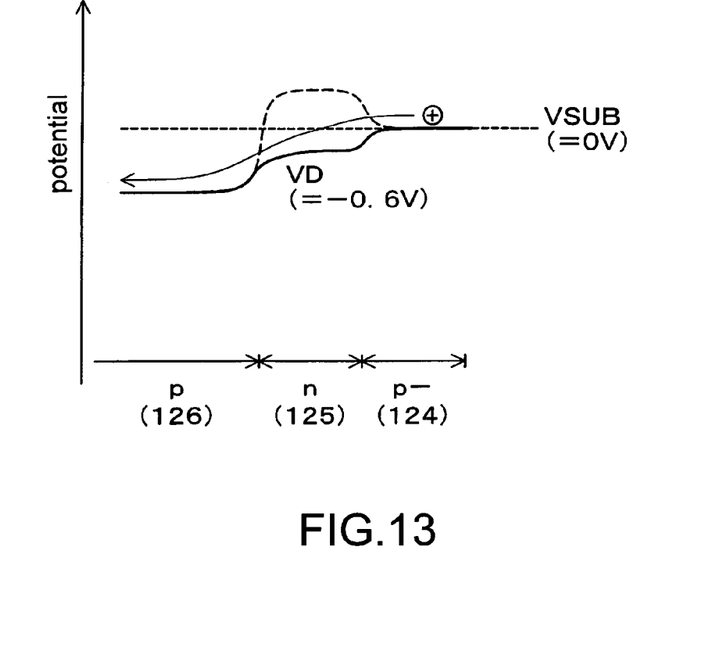
FIG. 13 is an explanatory diagram showing the potential distribution of a section along C—C line of FIG. 12.

FIG. 13 is an explanatory diagram showing the potential distribution of a section along C—C line of FIG. 12. In a pre-charge period, voltage 2V as the gate voltage VG is applied to the gate electrode 128 and voltage −0.6V as the drain voltage VD is applied to the drain diffused region (drain electrode) 129. Here, the substrate voltage VSUB that is applied to the P type substrate 121 is 0V. As shown by a dashed line of FIG. 13, the potential of the N well region 125 is usually higher than that of the P type substrate 121, specifically that of the P- type substrate layer 122 so as to isolate the N well region 125 adjacent thereto. However, if voltage −0.6V is applied to the drain diffused region 129 as the drain voltage VD, the potential of the N well region 125 is lowered as shown by a solid line such that the PN junction region between the P- type substrate layer 122 and the N well region 125 becomes a forward bias state effectively. In other words, it can be also considered that a parasitic bipolar transistor (PTr) provided with the P- type substrate layer 122, the N well region 125, and the P well region 126 becomes a conductive state. Thus, holes can be flowed from a side of the P type substrate 121, specifically a side of the P− type substrate layer 122 into the P well region 126. As a result, holes can be accumulated in the carrier pocket 131. Here, although voltage −0.6V is applied as the drain voltage VD in the embodiment, it should be understood that the invention is not limited thereto. Any voltage value is available if only the PN junction region between the P− type substrate layer 122 and the N well region 125 is in a forward bias state. In other words, any voltage value is available if only the parasitic bipolar transistor (PTr) provided with the P− type substrate layer 122, the N well region 125, and the P well region 126 is in a conductive state.

Figure 14:
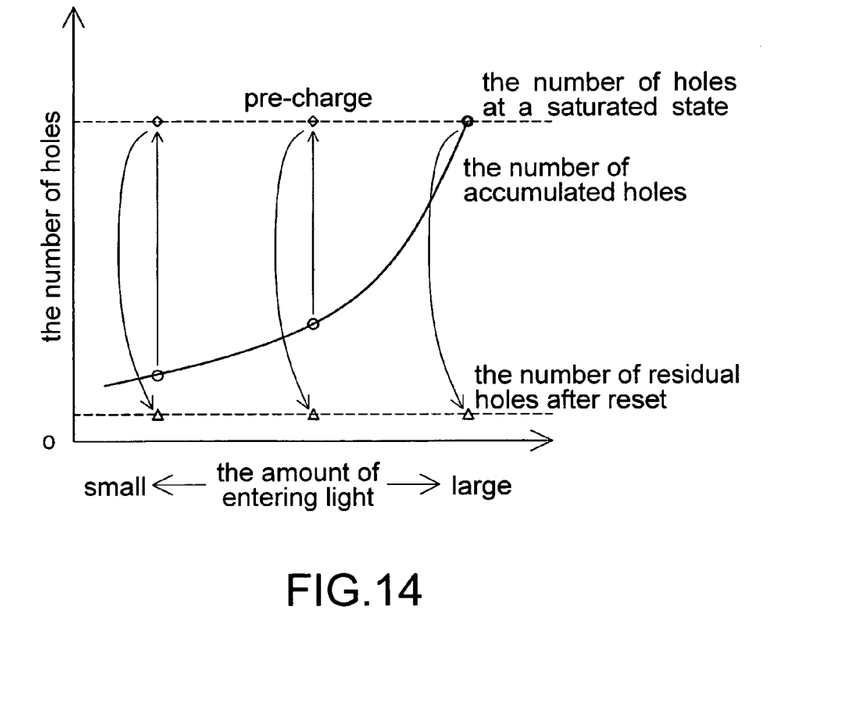
FIG. 14 is an explanatory diagram showing the number of holes after pre-charging.

FIG. 14 is an explanatory diagram showing the number of holes after pre-charging. The number of holes that can be accumulated in the carrier pocket 131 (it is referred to as "the number of holes at a saturated state" hereinafter) is finite. Thus, in a pre-charge period, holes are accumulated so that the carrier pocket 131 is saturated regardless of the number of holes accumulated before pre-charging. This allows the number of holes accumulated in the carrier pocket 131 after pre-charging to be almost constant every time regardless of the number of holes before pre-charging.

If the number of holes before the start of reset is almost constant, the number of residual holes after reset can be almost constant every time, too. Therefore, the number of residual holes becomes independent of the amount of entering light by subtracting N output in the period T5 of FIG. 11 from S output in the period T3 of FIG. 11 such that the problem of a residual image due to residual holes, which was shown in the imaging operation of the comparative example, can be avoided. Therefore, in a solid-state imaging element of a threshold voltage modulation system like the embodiment, the deterioration of image quality caused by a residual image due to photoholes accumulated in previous imaging can be avoided.

D. Modifications:

It should be understood that, the present invention is not limited to the above-described examples and embodiments and that various kinds of modifications can be made without departing from the scope and spirit of the present invention. For example, the following modifications are available.

Although pre-charging is executed so that the number of holes accumulated in the carrier pocket becomes a saturated state in the above-described embodiment, the present invention is not limited thereto and pre-charging may be executed so that the number of holes becomes a predetermined value without becoming a saturated state.

In the above-described embodiment, the case where the photo diode 111 and the transistor 112 for detecting photocharges share the P well region 126, and the transistor 112 for detecting photocharges is an NMOS transistor is described. However, a structure where the well region shared by the photo diode and the transistor for detecting photocharges is an N type well region, and the transistor for detecting photocharges is a PMOS transistor is available. In this case, photocharges (carriers) accumulated in the carrier pocket are not holes but electrons. In addition, the parasitic bipolar transistor, which becomes a conductive state during a pre-charge period, is not a PNP transistor but an NPN transistor.

What is claimed is:

1. A solid-state imaging device, comprising:
    a pixel array having a plurality of unit pixels, each of the unit pixels including a photo diode and an insulated gate field effect transistor that detects photocharges; and
    a control circuit that controls the operation of the pixel array, wherein:
    the photo diode and the insulated gate field effect transistor share a well region of a first conductivity type that is formed in a semiconductor layer of a second conductivity type, the semiconductor layer of the second conductivity type being formed on a semiconductor substrate of the first conductivity type;
    an accumulation region that accumulates charges of a given conductivity type generated in response to light incident on the photo diode that is formed in the well region of the insulated gate field effect transistor; and
    the control circuit configured to forward bias a junction region between the semiconductor substrate and the semiconductor layer so as to accumulate a predetermined amount of the charges of the given conductivity type during pre-charging regardless of an amount of the charges of the given conductivity type before pre-charging in the accumulation region, and discharges the charges of the given conductivity type accumulated in the accumulation region thereafter.

2. The solid-state imaging device according to claim 1, the insulated gate field effect transistor further comprising:
    a source diffused region of the second conductivity type formed on a surface of the well region;
    a drain diffused region of the second conductivity type formed on a surface of the semiconductor layer other than the surface of the well region;
    a gate electrode formed above the well region between the drain diffused region and the source diffused region with a gate insulating film therebetween;
    a channel region formed in the surface of the well region below the gate electrode and having an impurity layer of the second conductivity type; and
    the accumulation region being a heavily doped buried layer of the first conductivity type formed below the channel region in the well region and adjacent to the source diffused region, having an impurity concentration higher than that of the well region; and
    the control circuit applies predetermined voltage to at least the drain diffused region to forward bias the junction region so as to accumulate a predetermined amount of the charges of the given conductivity type in the accumulation region, and discharges the charges of the given conductivity type accumulated in the accumulation region thereafter.

3. The solid-state imaging device according to claim 1, wherein a state where a predetermined amount of the charges of the given conductivity type are accumulated is a saturated state where a maximum amount of available charges of a given conductivity type are accumulated in the accumulation region.

4. The solid-state imaging device according to claim 1, the charges of the given conductivity type being holes if the first conductivity type is a P type and the second conductivity type is an N type.

5. The solid-state imaging device according to claim 1, the charges of the given conductivity type being electrons if the first conductivity type is an N type and the second conductivity type is a P type.

* * * * *